United States Patent
Gygax et al.

(10) Patent No.: US 8,414,185 B2
(45) Date of Patent: Apr. 9, 2013

(54) MECHANICAL OSCILLATOR HAVING AN OPTIMIZED THERMOELASTIC COEFFICIENT

(75) Inventors: Pierre Gygax, Cortaillod (CH);
Marc-Andre Glassey, Bramois (CH)

(73) Assignee: Manufacture et Fabrique de Montres et Chronometres Ulysse Nardin le Locle S.A., Le Locle (CH)

(*) Notice: Subject to any disclaimer, the term of this patent is extended or adjusted under 35 U.S.C. 154(b) by 0 days.

(21) Appl. No.: 12/743,869

(22) PCT Filed: Nov. 28, 2007

(86) PCT No.: PCT/EP2007/062941
§ 371 (c)(1),
(2), (4) Date: Aug. 6, 2010

(87) PCT Pub. No.: WO2009/068091
PCT Pub. Date: Jun. 4, 2009

(65) Prior Publication Data
US 2010/0290320 A1    Nov. 18, 2010

(51) Int. Cl.
*G04B 17/04*    (2006.01)
(52) U.S. Cl.
USPC .................................. 368/175; 368/168
(58) Field of Classification Search .............. 368/175, 368/168–169, 176–178
See application file for complete search history.

(56) References Cited

U.S. PATENT DOCUMENTS

| 7,077,562 | B2* | 7/2006 | Bourgeois et al. | 368/175 |
| 7,503,688 | B2* | 3/2009 | Hessler et al. | 368/169 |
| 7,753,581 | B2* | 7/2010 | Hessler et al. | 368/140 |
| 7,889,028 | B2* | 2/2011 | Hessler et al. | 333/200 |
| 8,002,460 | B2* | 8/2011 | Daout et al. | 368/175 |
| 2005/0281137 | A1 | 12/2005 | Bourgeois | |
| 2008/0037376 | A1 | 2/2008 | Lippuner | |
| 2010/0214880 | A1* | 8/2010 | Rappo et al. | 368/127 |

FOREIGN PATENT DOCUMENTS

| DE | 10127733 A1 | 2/2003 |
| EP | 1422436 A1 | 5/2004 |
| EP | 1837722 A2 | 9/2007 |

OTHER PUBLICATIONS

International Search Report dated Oct. 17, 2008.

* cited by examiner

*Primary Examiner* — Sean Kayes
(74) *Attorney, Agent, or Firm* — Cooper Legal Group, LLC

(57) ABSTRACT

The invention relates to a mechanical oscillator, in particular for watchmaking, comprising a spiral spring (1) having a number N of turns, a central end (2), an eccentric end (3) and a rotary collet (4), connected to the central end (2), comprising an orifice intended to receive an arbor for rotation about an axis (A), and a balance (7), the axis of rotation of which coincides with the rotation arbor (A), the eccentric end (3) being intended to be integral with a stationary element of the "balance-cock" type, said spiral spring (1) being made up of a single-crystal silicon (Si) core (1a) and at least one peripheral coating (1b) based on a material having a thermoelastic coefficient different from that of silicon, the single-crystal silicon (Si) being oriented along the crystallographic axis $\{1,1,1\}$ to optimize the temperature coefficient of the mechanical oscillator as a whole. In addition, this invention likewise relates to a method of designing said mechanical oscillator, consisting in optimizing the temperature coefficient of the complete oscillator in order to limit its thermal drift.

11 Claims, 2 Drawing Sheets

MECHANICAL OSCILLATOR HAVING AN OPTIMIZED THERMOELASTIC COEFFICIENT

TECHNICAL FIELD OF THE INVENTION

This invention relates to the general technical field of mechanical oscillators, also referred to resonators or spiral balances, used in watchmaking, for example.

The invention concerns more specifically mechanical oscillators comprising a spiral spring and a balance and having a temperature coefficient which is suitable to be best reduced so as to limit the thermal drift of said oscillators which influences in a negative way the precision of the watchmaking piece.

Understood by thermal or thermoelastic coefficient should be the variation in seconds in the daily running of a horological movement for a difference in temperature of 1° C. (or 1° K).

BACKGROUND ART

Known by way of the document DE 101 27 733, for example, is to achieve spiral springs having a good resistance to large-scale thermal stresses as well as good stability in shape. These springs are made up of single-crystal silicon along diverse crystallographic axes. A coating of silicon dioxide can also cover the springs in question.

In addition the document EP 1 422 436 is known describing a method to reduce the thermal drift of a single spiral and thus to achieve a temperature coefficient of zero. This method uses the crystal anisotropy of silicon along one crystallographic axis in relation to another to obtain by way of calculations of thickness of a coating of silicon dioxide making it possible to minimize the thermal coefficients of the spring constant of the spiral spring. The spiral spring described thus ideally comprises a modulation of the thickness. Such a method has, on the one hand, a complexity in its implementation. On the other hand, the spiral springs produced according to this method (i.e. the spiral springs optimized toward a temperature coefficient of zero) do not allow adaptation to different types of balances.

SUMMARY OF INVENTION

The objects of the present invention aim at overcoming the aforementioned drawbacks and proposing mechanical oscillators whose sensitivity to thermal variations is minimal.

Another object of the present invention is to propose reliable and precise mechanical oscillators the design and manufacture of which are simplified.

Another object of the invention aims to propose a new method of designing mechanical oscillators allowing use of very diverse balances (in material, shape and coefficient of expansion), all giving the complete oscillator a very low temperature coefficient, even of zero.

The set objects of the invention are attained with the aid of a mechanical oscillator, in particular for watchmaking, comprising a spiral spring having a number N of turns, a central end, an eccentric end and a rotary collet connected to the central end comprising an orifice intended to receive an arbor for rotation about an axis (A), and a balance the axis of rotation of which coincides with the rotation arbor (A), the eccentric end being intended to be integral with a stationary element of the "balance-cock" type, said spiral spring being made up of a single-crystal silicon (Si) core and at least one peripheral coating based on a material having a thermoelastic coefficient different from that of silicon, wherein the cutting of the single-crystal silicon (Si) is oriented along the crystallographic axis {1,1,1} to optimize the temperature coefficient of the mechanical oscillator as a whole.

Mechanical oscillators are thus obtained whose number of beats per hour is almost invariable as a function of the temperature.

A spiral in single-crystal silicon cut along the crystallographic axis {1,1,1} has a module of isotropic elasticity. It is therefore not necessary to modulate the thickness of a turn to obtain a uniform deformation, and the second temperature coefficient of the spring constant, connected with an anisotropy, as is the case for an orientation along the crystallographic axis {1,0,0} for example, is non-existent.

Furthermore Young's modulus is higher for a spiral engraved along the crystallographic axis {1,1,1} than the average module for an engraving along the crystallographic axis {1,0,0}. Thus, for a spiral spring of the same winding, the spiral spring engraved along the crystallographic axis {1,1,1} will be able to be finer and thus lighter. This makes it possible to reduce the mass of the spiral spring and thus the variations in operation as a function of the position.

A finer spiral spring will also consequently require a lesser quantity of oxide to produce a coating achieving the thermal compensation.

It is important to note here that the spiral spring according to the invention and the rotary collet can be produced in two separate pieces (also using different materials) and attached one to the other by way of any attachment means, but can also be manufactured directly in a single piece (and a common material), without an attachment means between the two being necessary.

According to an example embodiment in accordance with the invention, the spiral spring is dimensioned and manufactured to have a temperature coefficient value allowing compensation of the temperature coefficient of the balance.

According to an example embodiment in accordance with the invention, the spiral spring has a length (L), a rectangular cross section of height (h) and of width (l) constant over the entire length (L).

According to a preferred example embodiment, the peripheral coating (1b) of thickness (e) is uniform and comprises at least one layer of coating of temperature coefficient opposite that of silicon. The coating is of silicon dioxide ($SiO_2$), for example, even if other materials are likewise possible.

According to an example embodiment of the oscillator in accordance with the invention, a means of attachment of the stud type is mounted and secured in a stationary way on the spiral spring, in a position in proximity to said eccentric end, to connect the latter in an integral way to the fixed element.

According to an example embodiment of the oscillator in accordance with the invention, the rotary collet forms an integral part of the spiral spring. This example embodiment is particularly suitable for springs in silicon since the manufacturing techniques used for that case permit production of the spiral spring with the drift in a single piece.

The set objects of the invention are also achieved with the aid of a method of design of a mechanical oscillator such as that presented above, characterized in that it consists in optimizing the temperature coefficient of the whole oscillator in order to limit its thermal drift by:

a) using single-crystal silicon (Si) engraved along the crystallographic axis {1,1,1} to achieve the spiral spring, b) determining particular physical parameters of the balance connected with its form and its constituent material, c) determining, depending upon particular physical parameters, the dimensions of the spiral spring (L,h,l) and the thickness (e) of the peripheral coating.

According to an example implementation, the method in accordance with the invention consists in carrying out step c) by calculation. The detailed step of the calculation will be described further below.

According to another example implementation, the method in accordance with the invention consists in determining the dimensions of the spiral spring (L,h,l) by calculation and in determining experimentally the thickness (e) of the peripheral coating so as to obtain a temperature coefficient for the whole oscillator close to zero.

The method consists for example in:
c1) applying on the spiral spring a layer of peripheral coating of a thickness (e1),
c2) measuring the temperature coefficient of the whole oscillator,
c3) depending upon the result of the measurement carried out under c2), taking the preceding steps and this until a temperature coefficient is obtained close to zero.

The method in accordance with the invention thus makes it possible in an advantageous way to compensate the thermal drift of the balance with the aid of the spiral spring, in particular for a balance spiral torque of quality 1, corresponding to a temperature coefficient less than or equal to +/−0.6 s/j/deg.

The growth of a layer of oxide on a silicon oriented along the crystallographic axis {1,1,1} is achieved by process of damp oxidation and allows rendering positive the temperature coefficient for the spiral spring and obtaining a variation, as a function of the temperature, of the resilient torque of the spiral spring, compensating the variation as a function of the temperature of the moment of inertia of the balance. Thus it is no longer necessary to make tend toward zero the temperature coefficient of the spring constant of the spiral in order to minimize the thermal drift of the oscillator according to the invention. It must then be possible to achieve in a simple way a particular spiral spring, for a given balance, characterized by predetermined physical parameters such as its mass, its moment of inertia, its material, its radius of gyration and its coefficient of expansion.

BRIEF DESCRIPTION OF DRAWINGS

Other features and advantages will become apparent in more detail from reading the description which follows, as well as with the aid of the attached drawings, given in an illustrative and non-limiting way, among which.

DETAILED DISCLOSURE OF INVENTION

Figure 1:
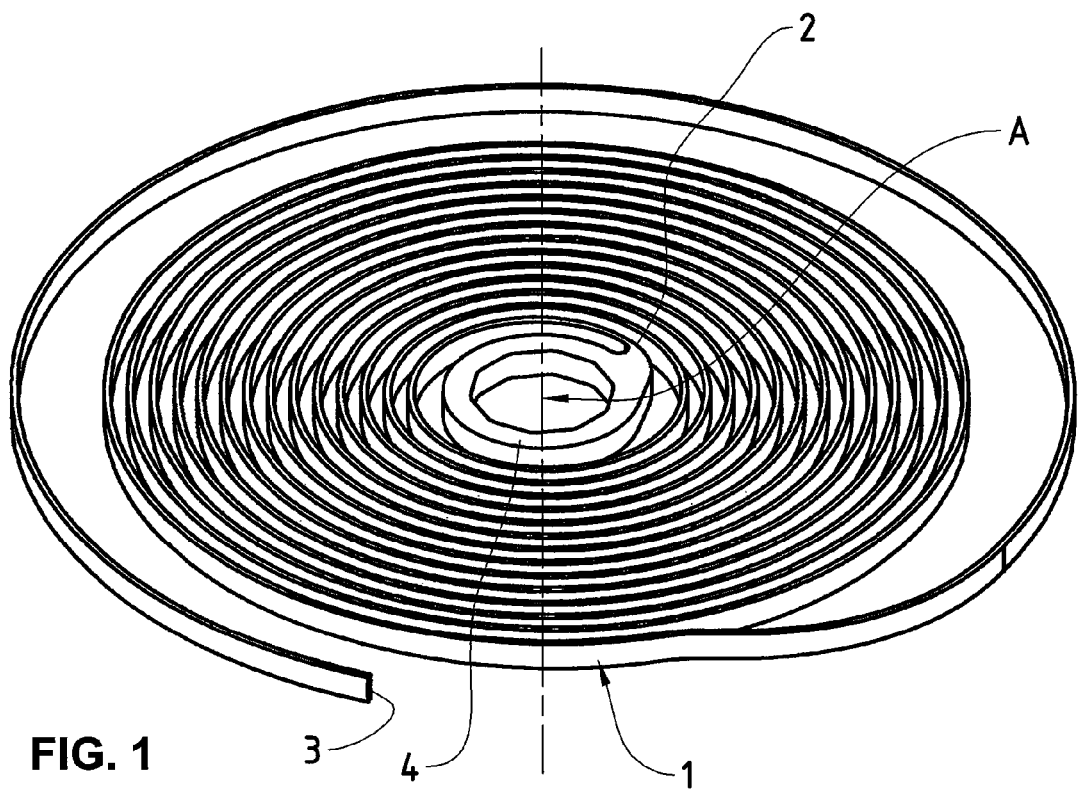
FIG. 1 illustrates an example embodiment of a spiral spring used in the mechanical oscillator according to the invention, represented in perspective.

FIG. 1 represents an example embodiment of a spiral spring 1 which can be used in a mechanical oscillator according to the invention. The spiral spring 1 has a central end 2 and an eccentric end 3. The central end 2 is integral with a rotary collet 4, provided with an orifice intended to receive an arbor of rotation about an axis of rotation A (represented by a broken line). The rotary collet 4 is intended to be mounted on a stationary support (not shown). The rotary collet 4 and the spiral spring 1 can be produced in particular in a single piece, without a separate mounting being necessary. It is nevertheless also conceivable for the rotary collet 4 to be formed separately and be fixed to the central end 2 of the spiral spring 1 by means of a known mounting. The eccentric end 3 is intended to be integral with a stationary element called "balance-cock" and not represented in the figures. For this purpose several means of common mountings are possible.

Figure 2:
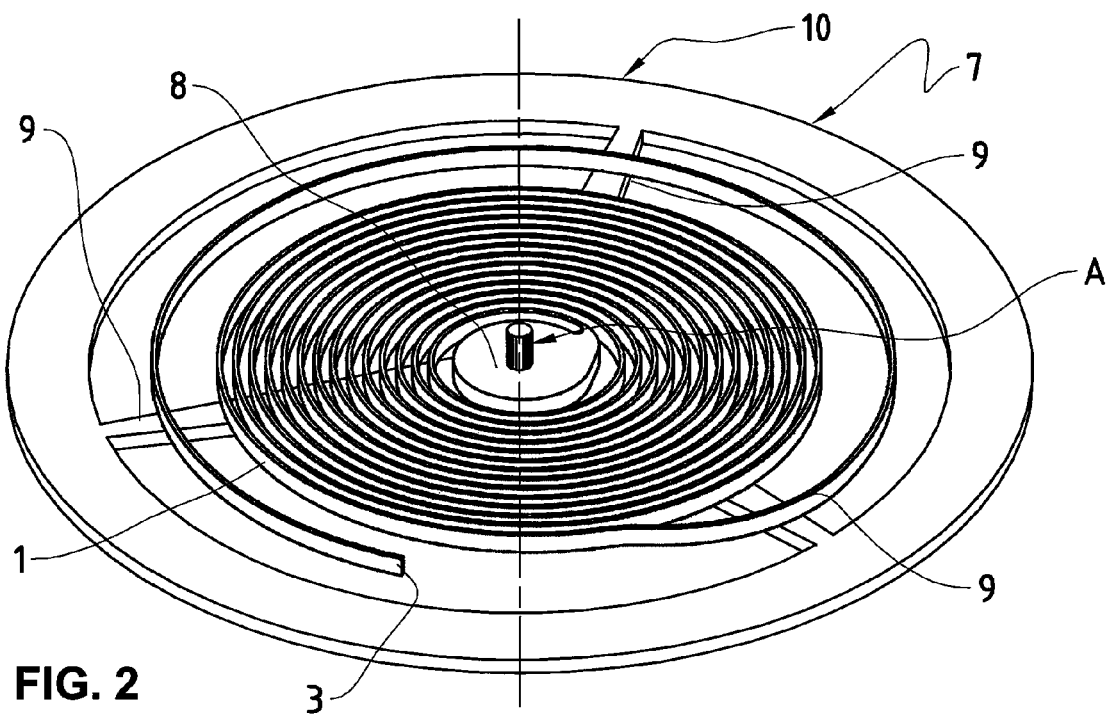
FIG. 2 represents an example embodiment of a mechanical oscillator according to the invention comprising the spiral spring shown in FIG. 1.
Figure 3:
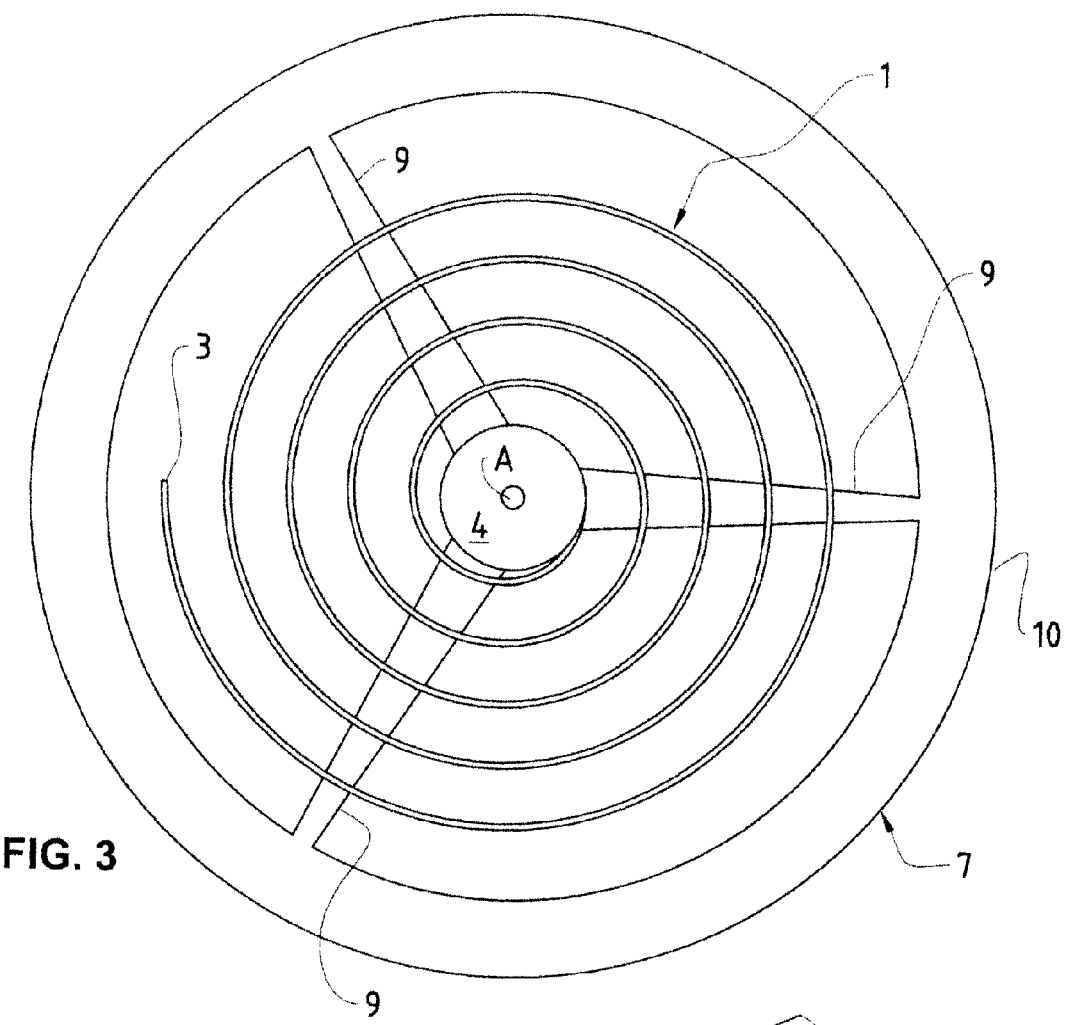
FIG. 3 represents the mechanical oscillator of FIG. 1 seen from below.

The mechanical oscillator according to the invention is represented in FIGS. 2 and 3 <and> likewise comprises a balance 7, integral in rotation with the rotary collet 4, and whose axis of rotation coincides with the axis of the arbor A. The balance 7 comprises a mounting part 8 centered on the arbor A and radial arms 9 connecting said mounting part 8 to a rim 10.

Figure 4:
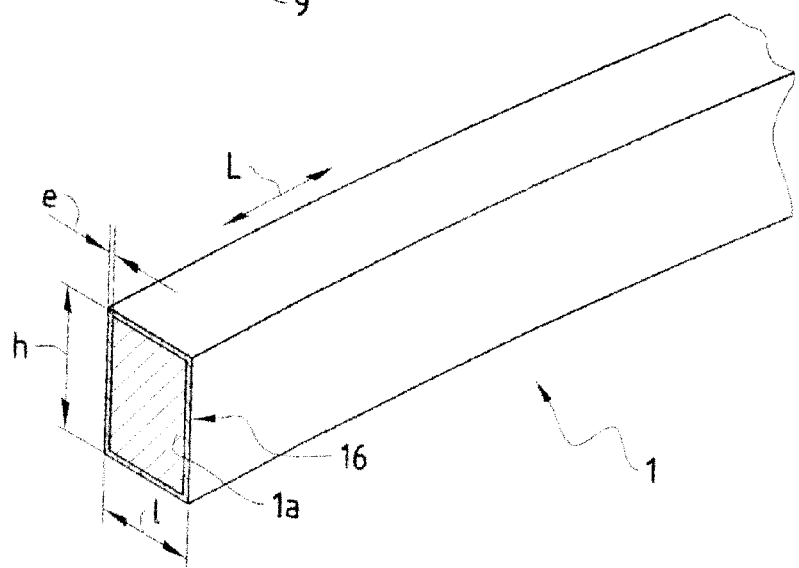
FIG. 4 illustrates, in section, a detail of an example embodiment of a spiral spring of a mechanical oscillator according to the invention.

An example embodiment of the spiral spring 1 is represented in FIG. 4. The spiral spring 1 is made up of a core 1a of single-crystal silicon (Si), the growth of which is made following the crystallographic axis {1,1,1}. The core 1a, of rectangular cross section, is covered with a peripheral coating 1b of thickness (e). The latter is made up of a material having a thermoelastic coefficient opposite that of silicon. By way of example, this material can be a layer of oxidation of silicon dioxide type ($SiO_2$).

The spiral spring 1 has a length (L), a width (l) and a height (h). The number of turns N of the spiral spring is determined based on specific properties sought for each mechanical oscillator. This determination is known per se.

To illustrate the necessity of having to adjust the temperature coefficient of the spiral to that of the balance, considered can be the input formula (I):

$$Ah = \frac{7200}{2*\pi}\sqrt{\frac{M}{I}} \quad \begin{array}{l} Ah = \text{Number of beats per hour} \\ I = \text{Moment of inertia of the balance} \\ M = \text{resilient torque of the spiral} \end{array}$$

It is noted from this formula that for the same balance, M being constant, the number of beats decreases if the inertia increases.

The following table shows us the influence of the difference in temperature coefficient owing to two balances made of materials having a different coefficient of expansion. The result is calculated using the following formulae designated (II) and (III) in the input formula (I).

Formula (II): Calculation of inertia $$I = m*r^2$$

I=Moment of inertia of the balance
m=Mass of the balance
r=Radius of gyration of the balance
Formula (III): the inertia as a function of T=I(T)

$$I(T) = m*((T*\alpha+1)*r)^2$$

I=Moment of inertia of the balance
m=Mass of the balance
r=Radius of gyration of the balance
T=Difference in temperature in relation to 20°
A=Coefficient of expansion

TABLE 1

| | (basis 28800 beats ??/hour, radius 5 mm) | | |
|---|---|---|---|
| Material | Coefficient de expansion | Delta beats/h/deg | Temperature coefficient: CT (s/j/deg) |
| BeCu | 18*10−6 | −0.52 | −1.56 |
| Platinum | 9 * 10−6 | −0.26 | −0.78 |

The influence of the temperature on the balance only.

Since Ah(T) is invariable, it is necessary for the variation of M(T) and of (T) as a function of T to be of the same sign and of the same value. The effects of M(T) and of (T) can be noted in the formula (I).

It remains to be said that dM/dT=dl/dT.

I(T), the moment of inertia as a function of the temperature is described in the formula (III).

In the case of a spiral of silicon covered by a uniform layer of oxide, M(T), the resilient torque of the spiral can thus be calculated with the aid of the following formulae:

$$M(T) = M_{si} * (CTE_{si}) + M_{ox} * (1 + CTE_{ox})$$

$M$ = Resilient torque of the spiral
$M_{si}$ = Resilient torque (of the ?) silicon
$M_{ox}$ = Resilient torque (of the?) oxide
$CTE_{si}$ = Thermoelastic (?) coefficient of silicon
$CTE_{ox}$ = Thermoelastic (?) coefficient of oxide Formula (IV)

$$M_{si} = \frac{E_{si} * (h - 2e) * (l - 2e)^3}{12L}$$

$E_{si}$ = Modulus of elasticity (Young's modulus??) of silicon
$h$ = Height of the blade
$l$ = Thickness of the blade
$L$ = Length of the uncoiled spiral
$E$ = Thickness of the oxide Formula (V)

$$M_{ox} = \frac{E_{ox}}{12L} * ((h) * (l)^3) - ((h - 2e) * (l - 2e)^3)$$

$E_{ox}$ = Modulus of elasticity of silicon
$h$ = Height of the blade
$l$ = Thickness of the blade
$L$ = Length of the uncoiled spiral
$e$ = Thickness of the oxide Formula (VI)

The invention claimed is:

1. A mechanical oscillator for watchmaking, the mechanical oscillator comprising:
   a spiral spring (1) having a number N of turns, a central end (2), an eccentric end (3), and a rotary collet (4) connected to the central end (2), the rotary collet defining an orifice that is capable of receiving an arbor for rotation about an axis (A), said spiral spring (1) being made up of a single-crystal silicon (Si) core (1a) and at least one peripheral coating (1b) having a thermoelastic coefficient different from that of silicon; and
   a balance (7), the axis of rotation of which coincides with axis (A),
   wherein the single-crystal silicon (Si) is cut along the crystallographic axis {1,1,1} and the spiral spring has a dimension that is selected based on the temperature coefficient of the mechanical oscillator.

2. The mechanical oscillator according to claim 1, wherein the dimension is a thickness (e) of the at least one peripheral coating.

3. The mechanical oscillator according to claim 1, wherein the spiral spring (1) has a length (L) and a rectangular cross section of height (h) and of width (l), the rectangular cross section being constant over the entire length (L).

4. The mechanical oscillator according to claim 1, wherein the at least one peripheral coating (1b) is uniform and comprises at least one layer of coating of temperature coefficient opposite that of silicon.

5. The mechanical oscillator according to claim 4, wherein the at least one peripheral coating (1b) is a growth of silicon dioxide ($SiO_2$).

6. The mechanical oscillator according to claim 1, wherein the spiral spring includes a means for attaching the eccentric end to a fixed element.

7. The mechanical oscillator according to claim 1, wherein the rotary collet (4) forms an integral part of the spiral spring (1).

8. A method of making a mechanical oscillator comprising a balance and a spiral spring, said spiral spring (1) being, made up of a single-crystal silicon (Si) core (1a) and a peripheral coating (1b) having a thermoelastic coefficient different from that of silicon, wherein the method comprises the steps of:
   a) cutting the single-crystal silicon (Si) along the crystallographic axis {1,1,1} to achieve, the spiral spring (1) and covering the spiral spring (1) with the peripheral coating (1b) having the thermoelastic coefficient different from that of silicon,
   b) determining particular physical parameters of the balance (7) connected with the form and constituent material of the balance, and
   c) determining, depending upon the particular physical parameters, dimensions of the spiral spring (L,h,l) and a thickness (e) of the peripheral coating (1b) such that the temperature of the mechanical oscillator is within a predetermined range.

9. The method according to claim 8, wherein the dimensions of the spiral spring (L,h,l) and the thickness (e) of the peripheral coating (1b) are determined by calculation.

10. The method according to claim 8, wherein the dimensions of the spiral spring (L,h,l) are determined by calculation and the thickness (e) of the peripheral coating (1b) is determined experimentally such that the temperature coefficient for the mechanical oscillator is close, to zero.

11. The method according to claim 10, wherein the method further comprises the steps of:
- c1) applying to the spiral spring (1) an additional layer of peripheral coating (1*b*) of a thickness (e1).
- c2) measuring the temperature coefficient of the mechanical oscillator, and
- c3) repeating steps c1) and c2) until the temperature coefficient for the mechanical oscillator is close to zero.

\* \* \* \* \*

UNITED STATES PATENT AND TRADEMARK OFFICE
CERTIFICATE OF CORRECTION

PATENT NO. : 8,414,185 B2  
APPLICATION NO. : 12/743869  
DATED : April 9, 2013  
INVENTOR(S) : Pierre Gygax et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 201 days.

In the Specifications:

Column 5, line 12, please delete "(T)" and insert --I(T)--

Column 5, line 13, please delete "(T)" and insert --I(T)--

Column 5, line 23, Formula (IV), please delete "(CTEsi)" and insert --(1+CTEsi)--

In the Claims:

Column 6, line 18, please delete "being," and insert --being--

Column 6, line 50, please delete "achieve," and insert --achieve--

Column 7, line 2, please delete "close," and insert --close--

Signed and Sealed this  
Eighteenth Day of June, 2013

Teresa Stanek Rea  
*Acting Director of the United States Patent and Trademark Office*